United States Patent
Koenig et al.

(10) Patent No.: US 6,851,383 B1
(45) Date of Patent: Feb. 8, 2005

(54) SUPPLY METER FOR LIQUID AND GASEOUS MEDIUMS

(75) Inventors: Peter Wilhelm Koenig, Hamburg (DE); Martin Hinzmann, Hamburg (DE)

(73) Assignee: Utility Consult Hinzmann & Koenig OHG (DE)

(*) Notice: Subject to any disclaimer, the term of this patent is extended or adjusted under 35 U.S.C. 154(b) by 0 days.

(21) Appl. No.: 10/088,626
(22) PCT Filed: Jul. 21, 2000
(86) PCT No.: PCT/DE00/02375
§ 371 (c)(1), (2), (4) Date: Mar. 18, 2002
(87) PCT Pub. No.: WO01/22036
PCT Pub. Date: Mar. 29, 2001

(30) Foreign Application Priority Data

Sep. 18, 1999 (DE) .......................... 199 44 788

(51) Int. Cl.[7] .............................. G01F 15/06; G01F 1/05
(52) U.S. Cl. ........................................................ 116/264
(58) Field of Search .............................. 116/264, 269, 116/265, 266

(56) References Cited

U.S. PATENT DOCUMENTS

| 1,607,512 | A | * | 11/1926 | Churcher | 116/264 |
|---|---|---|---|---|---|
| 2,090,487 | A | * | 8/1937 | Schwartz | 116/264 |
| 2,987,247 | A | * | 6/1961 | Englund | 235/61 PD |
| 3,141,150 | A | * | 7/1964 | Vancsa et al. | 714/806 |
| 3,310,801 | A | * | 3/1967 | Hood, Jr. et al. | 341/2 |
| 4,593,365 | A | * | 6/1986 | Haley et al. | 702/46 |
| 5,058,525 | A | * | 10/1991 | Rilling | 116/200 |
| 5,235,565 | A | * | 8/1993 | Aschenbrouich et al. | 368/90 |
| 5,419,360 | A | * | 5/1995 | Lechevalier | 116/264 |
| 5,471,137 | A | * | 11/1995 | Briese et al. | 324/158.1 |
| 5,631,636 | A | * | 5/1997 | Bane | 340/825.69 |
| 5,798,697 | A | * | 8/1998 | Wiseman | 116/264 |
| 6,014,021 | A | * | 1/2000 | Le Van Suu | 324/142 |

FOREIGN PATENT DOCUMENTS

| DE | WO 98/48249 | * | 10/1998 | G01F/25/00 |
|---|---|---|---|---|
| EP | 0124434 | * | 11/1984 | G06M/3/06 |
| FR | 2772167 A1 | * | 6/1999 | G07B/15/00 |

* cited by examiner

Primary Examiner—Christopher W. Fulton
Assistant Examiner—R. Alexander Smith
(74) Attorney, Agent, or Firm—Pendorf & Cutliff

(57) ABSTRACT

The invention relates to a supply meter for liquid or gaseous mediums or electric current. The supply meter is provided with a display device for the medium that passes the supply meter. The entire previous supply is displayed by means of a cumulated meter reading. A verification code can be produced by said meter reading. The verification code display device is mechanically linked to the gear of the supply display device.

12 Claims, 1 Drawing Sheet

SUPPLY METER FOR LIQUID AND GASEOUS MEDIUMS

CROSS REFERENCE TO RELATED APPLICATION

This application is a national stage of PCT/DE00/02375 filed Jul. 21, 2000 and based upon DE 199 44 788.8 filed Sep. 18, 1999 under the International Convention.

BACKGROUND OF THE INVENTION

1. Field of the Invention

The invention concerns a supply meter for liquid or gaseous mediums or electric current, including a display device for the amount of the medium that has passed through the supply meter, which displays the entire previous supply in a cumulative meter reading and makes possible the provision of a verification code.

2. Description of the Related Art

A supply meter of this type is known from DE 19623044 A1. This known supply meter works electronically and has an electro-optic display device for display of the consumed amount, a verification code for the used amount, and a condition verification code for the supply meter. This supply meter makes possible a verifiable evaluation of the read consumption value and the condition of the supply meter. For reading the supply meter, the consumer or, as the case may be, the meter-reader transposes the actual as well as the encoded display values to a card which then can be evaluated by the supplier, who can then verify the correctness of the reading by decoding the encoded display values. Due to the complex design and the necessary electronic construction components the manufacturing costs are substantially higher in comparison to the mechanical supply meters.

SUMMARY OF THE INVENTION

It is the task of the invention to design a supply meter of the above-described type in such a manner, that consumed amounts can be reliably evaluated without electronic construction components, and yet the accuracy of the meter reading as well as the meter condition can be verified using a verification code.

The supply meter in accordance with the invention has a mechanical display for the amount of the supply medium which has passed through the supply meter, which displays with a cumulative meter reading the total consumption to date and in addition makes possible the provision of a verification code. The generation of the verification code occurs by mechanical gears, of which the translation relationship depends upon the construction design and may differ from 1:10. The representation of the verification code occurs on rollers or disks, of which the segment count can be other than 10. For the display of the verification code it is also possible to use numerals, figures or symbols. If the display of the verification code occurs in the form of numbers or letters, the segments of the rollers or disks need not be consecutively encoded, but rather for increasing the difficulty of manipulation may use a non-convention sequence, which may be for example "17, 2, 3, 1, 5, 9, 0, 4, 6, 8" or ""B, X, K, Z, D, A, L, O, E, F". Insofar as letters or numbers are employed for representing the verification code, these represent particular values, which can be evaluated as information. The rotating bodies of the verification code display device can be connected at any point with the drive means or gears of the supply meter device. There need only be continuity between respectively the display of the verification code display device and the device number in the zero position of the supply meter display, since this verification code then forms the basis for the later evaluation of the determined verification code data. Therein the employed translation relationship between the drive of the supply meter display device and the verification code device is taken into consideration. This can be for example 1:3.5.

BRIEF DESCRIPTION OF THE DRAWING

The invention will now be described in greater detail on the basis of the illustrative embodiment of a supply meter represented in the figures. There is shown.

DETAILED DESCRIPTION OF THE INVENTION

Figure 1:
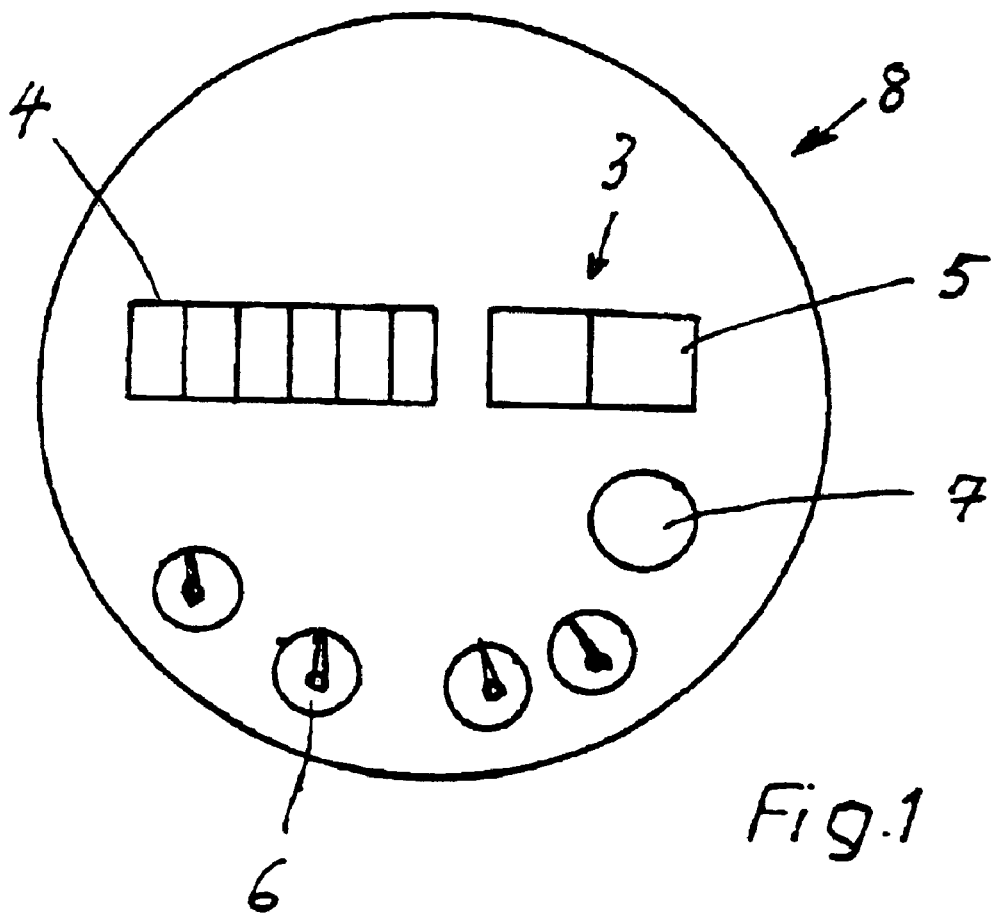
FIG. 1 a view upon the display of the supply meter.
Figure 2:
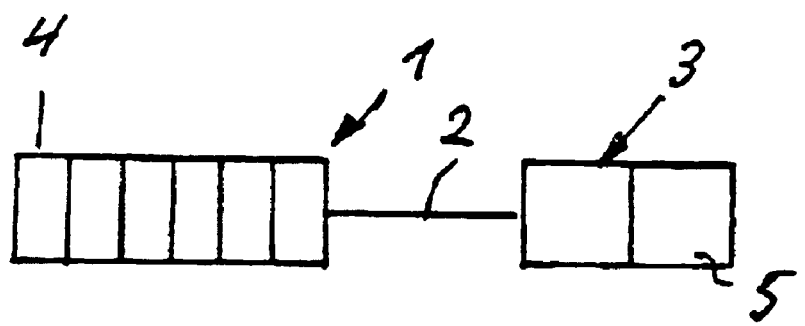
FIG. 2 the schematic of the connection of supply meter display device and verification code display device.

The display 8 of the supply meter includes a numeric display 4 for the consumed amount, which display can be comprised of parallel to each other arranged rollers or dials with numeric imprints. Parallel to the numeric display of consumed amount 4 is provided a verification code display 5, which likewise is comprised of dials, upon which numbers, symbols, letters or the like can be provided next to each other. The verification code display 5 can be covered using a not shown cover, which could be operated using a push key or button 7. Preferably the push key or button 7 is cushioned. This can be accomplished using a spring, an air cushion or an oil cushion. Further, the display 8 may also include a known consumed amount display 6 by means of which the respective consumed quantity of the medium is displayed.

The verification code display device 3 is rigidly connected with the drive means 1 for the consumed amount display device via a gear connection means 2. The translation relationship between the gear 1 and the verification code display device 3 can be freely selected and may be for example 1:3.5. The knowledge of the setting of the translation relationship is essential for the evaluation of the verification code.

What is claimed is:

1. A supply meter for liquid or gaseous medium or electric current, with a display device for displaying the amount of the medium which has passed through the supply meter, which displays with a cumulative meter reading the entire amount consumed to date and makes possible the production of a verification code, wherein:

(a) a separate verification code display device (3) is mechanically linked with the gear (1) for the consumed-amount display-device (4) via a gear connection means (2), and (b) that the translation relationship between the gear (1) and the verification code display device (3) is freely selectable depending upon the construction design of the gear connection means (2).

2. A supply meter according to claim 1, wherein the verification code provided by the verification code display device (3) is a product of the position of the consumed-amount display-device (4), the setting of the verification code display device (3) when the consumed-amount display-device (4) was in the zero or start position, and the translation relationship between the gear (1) and the verification code display device (3).

3. A supply meter according to claim 1, wherein the verification code display device (3) is a rotating body.

4. A supply meter according to claim 3, wherein the verification code display device (3) is a rotating display.

5. A supply meter according to claim 3, wherein the verification code display device (3) is a disk display.

6. A supply meter according to claim 1, wherein the verification code display device (3) displays a verification code for the cumulative meter reading.

7. A supply meter according to claim 1, wherein the verification code display device (3) is fixed or set in the zero position of the supply meter display device, in order to generate a portion of the device number.

8. A supply meter according to claim 1, wherein the verification code display device (3) displays, encoded, the cumulative meter reading and device specific data of the supply meter.

9. A supply meter according to claim 8, wherein as the device specific data there is displayed the device number and/or device type.

10. A supply meter according to claim 1, wherein the verification code display device (3) displays the verification code in the form of letters, characters, numbers or symbols.

11. A supply meter according to claim 1, wherein a cover provided over the display surface of the verification code display device (3) is operable by means of a mechanical push button (7).

12. A supply meter according to claim 11, wherein the push button (7) is cushioned.

* * * * *